(12) United States Patent
Usui

(10) Patent No.: US 8,707,794 B2
(45) Date of Patent: Apr. 29, 2014

(54) PRESSURE SENSOR DEVICE, ELECTRONIC APPARATUS, AND METHOD OF MOUNTING PRESSURE SENSOR DEVICE

(75) Inventor: Takashi Usui, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 357 days.

(21) Appl. No.: 13/210,496

(22) Filed: Aug. 16, 2011

(65) Prior Publication Data
US 2012/0048025 A1 Mar. 1, 2012

(30) Foreign Application Priority Data
Aug. 31, 2010 (JP) ................................. 2010-194631

(51) Int. Cl.
*G01L 9/00* (2006.01)

(52) U.S. Cl.
USPC .................... 73/754; 73/700; 73/753; 73/756

(58) Field of Classification Search
USPC .................... 73/754, 756, 753, 700
See application file for complete search history.

(56) References Cited

U.S. PATENT DOCUMENTS

| 4,314,225 | A | * | 2/1982 | Tominaga et al. | 338/4 |
|---|---|---|---|---|---|
| 5,225,373 | A | * | 7/1993 | Takahashi et al. | 438/51 |
| 5,861,558 | A | * | 1/1999 | Buhl et al. | 73/777 |
| 6,066,882 | A | * | 5/2000 | Kato | 257/414 |
| 8,220,338 | B2 | * | 7/2012 | Tojo | 73/754 |
| 2007/0107522 | A1 | * | 5/2007 | Oikawa et al. | 73/754 |
| 2008/0173096 | A1 | * | 7/2008 | Sato et al. | 73/754 |

FOREIGN PATENT DOCUMENTS

| JP | 11-064140 | 3/1999 |
|---|---|---|
| JP | 11-326088 | 11/1999 |
| JP | 2010-008434 | 1/2010 |
| JP | 2010-182864 | 8/2010 |

OTHER PUBLICATIONS

Japanese office action mailed Oct. 1, 2013.

* cited by examiner

*Primary Examiner* — Hezron E Williams
*Assistant Examiner* — Marrit Eyassu
(74) *Attorney, Agent, or Firm* — IPUSA, PLLC

(57) ABSTRACT

A pressure sensor device includes a semiconductor pressure sensor element and a base part. The base part includes a mounting surface, a through hole having an opening on the mounting surface and configured to introduce a fluid to the semiconductor pressure sensor element, a soldered part that is to be soldered and is provided on the mounting surface, and a step-like structure formed on the mounting surface between the opening and the soldered part.

5 Claims, 10 Drawing Sheets

FIG.9

| | DIMENSIONS (mm) | LARGE AMOUNT OF SOLDER WAS SUPPLIED | | |
|---|---|---|---|---|
| | | NUMBER OF TESTS | NUMBER OF FAILURES | FAILURE RATE |
| 8A | A=0.2 B=0.2 | 9 | 2 | 22% |
| 8B | A=0.4 B=0.2 | 9 | 2 | 22% |
| 8C | A=0.3 B=0.3 | 20 | 0 | 0% |
| 8D | A=0.2 B=0.4 | 15 | 0 | 0% |
| 8E | A=0.2 B=0.2 C=0.2 D=0.2 | 9 | 1 | 11% |
| 8F | G=φ1.6 | 9 | 1 | 11% |

PRESSURE SENSOR DEVICE, ELECTRONIC APPARATUS, AND METHOD OF MOUNTING PRESSURE SENSOR DEVICE

CROSS-REFERENCE TO RELATED APPLICATION

The present application is based upon and claims the benefit of priority of Japanese Patent Application No. 2010-194631, filed on Aug. 31, 2010, the entire contents of which are incorporated herein by reference.

BACKGROUND OF THE INVENTION

1. Field of the Invention

A certain aspect of this disclosure relates to a pressure sensor device, an electronic apparatus including the pressure sensor device, and a method of mounting the pressure sensor device.

2. Description of the Related Art

FIG. 1 is a cut-away side view of a pressure sensor device 1 mounted on a circuit board 21. The pressure sensor device 1 includes a mounting substrate 12, a semiconductor pressure sensor element 11 mounted on the mounting substrate 12, and a housing 16 for housing (or packaging) the semiconductor pressure sensor element 11. Terminals 19 are provided on the mounting substrate 12. The pressure sensor device 1 is fixed to a mounting surface 21A of the circuit board 21 by soldering the terminals 19 with solder 32 onto the mounting surface 21A. The semiconductor pressure sensor element 11 is a chip for detecting a pressure supplied from a pressure supply port 17 formed in the housing 16.

A pressure introducing port 18 communicating with the atmosphere may be formed in the mounting substrate 12 if the semiconductor pressure sensor element 11 needs to communicate with the atmosphere to implement its function. The pressure introducing port 18 is coaxially connected to a pressure introducing port 22 formed in the circuit board 21 and communicating with the atmosphere.

A pressure sensor device including a semiconductor pressure sensor element is disclosed, for example, in Japanese Laid-Open Patent Publication No. 11-326088 and Japanese Laid-Open Patent Publication No. 2010-008434.

With the configuration of FIG. 1, if the amount of flux in the solder for soldering the pressure sensor device 1 onto the circuit board 21 is large, liquefied flux tends to flow into a gap 33 formed between a mounting surface 12B of the mounting substrate 12 and the mounting surface 21A of the circuit board 21 due to the capillary action. The liquefied flux flown into the gap 33 proceeds along the mounting surface 12B and/or the mounting surface 21A due to their wettability and thus may clog the pressure introducing port 18 and/or the pressure introducing port 22. This in turn causes the pressure sensor device 1 to malfunction.

SUMMARY OF THE INVENTION

In an aspect of this disclosure, there is provided a pressure sensor device including a semiconductor pressure sensor element and a base part. The base part includes a mounting surface, a through hole having an opening on the mounting surface and configured to introduce a fluid to the semiconductor pressure sensor element, a soldered part that is to be soldered and is provided on the mounting surface, and a step-like structure formed on the mounting surface between the opening and the soldered part.

BRIEF DESCRIPTION OF THE DRAWINGS

FIG. 9 is a table illustrating results of clogging tests;

DESCRIPTION OF THE PREFERRED EMBODIMENTS

Preferred embodiments of the present invention are described below with reference to the accompanying drawings.

Figure 1:
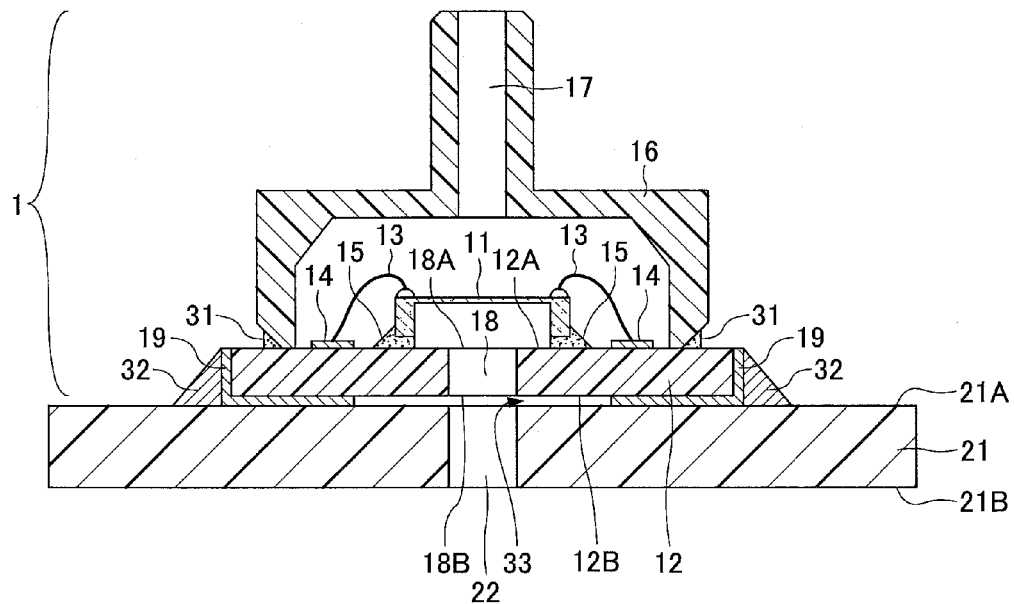
FIG. 1 is a cut-away side view of a pressure sensor device mounted on a circuit board.
Figure 2:
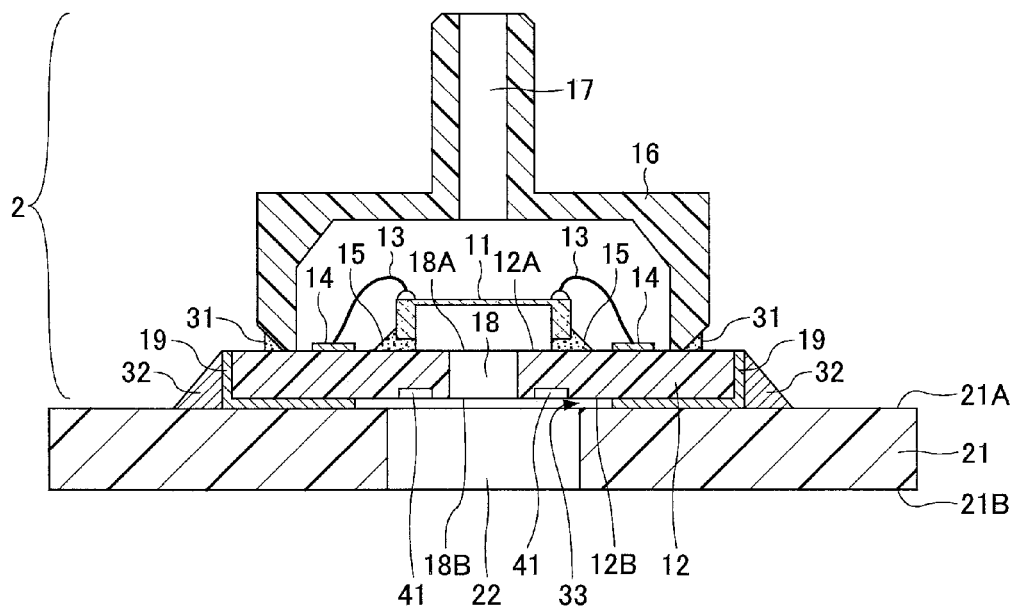
FIG. 2 is a cut-away side view of a pressure sensor device mounted on a circuit board according to an embodiment.

FIG. 2 is a cut-away side view of a pressure sensor device 2 mounted on a circuit board 21 according to an embodiment. The pressure sensor device 2 includes a semiconductor pressure sensor element 11, a mounting substrate 12, and a housing 16. The semiconductor pressure sensor element 11 is bonded with an adhesive 15 such as a silicon resin to a mounting surface 12A of the mounting substrate 12 and housed (or packaged) in the housing 16. The pressure sensor device 2 is fixed to a mounting surface 21A of the circuit board 21 by soldering terminals 19 provided on a mounting surface 12B of the mounting substrate 12 onto lands (not shown) provided on the mounting surface 21A. The circuit board 21 is, for example, a component of an electronic apparatus such as a pressure gauge that uses a pressure value detected by the pressure sensor device 2.

The mounting substrate 12 is a base part for fixing the semiconductor pressure sensor element 11. The mounting substrate 12 has the mounting surface 12A on which the semiconductor pressure sensor element 11 is mounted. The semiconductor pressure sensor element 11 is connected via bonding wires 13 (i.e., wire-bonded) to bonding pads 14 formed on the mounting surface 12A. The semiconductor pressure sensor element 11 is housed within the housing 16 that is bonded with an adhesive 31 such as an epoxy resin to the mounting surface 12A of the mounting substrate 12.

The semiconductor pressure sensor element 11 detects a pressure of a fluid such as a gas supplied from a cylindrical pressure supply port 17 formed in the housing 16. The semiconductor pressure sensor element 11 includes a diaphragm that is distorted or displaced by a pressure. For example, the semiconductor pressure sensor element 11 may be implemented by a semiconductor distortion gauge that detects the distortion of the diaphragm as a change in the resistance, or by a capacitance pressure sensor that detects the displacement of the diaphragm as a change in the capacitance. Also, the semiconductor pressure sensor element 11 may be implemented by any other type of sensor element.

The semiconductor pressure sensor element 11 is disposed below the pressure supply port 17 of the housing 16 and above the pressure introducing port 18 of the mounting substrate 12 such that the diaphragm is positioned between the pressure supply port 17 and the pressure introducing port 18. The amount of distortion (or displacement) of the diaphragm varies depending on the difference between a pressure to be measured which is applied through the pressure supply port 17 and the atmospheric pressure applied through the pressure introducing port 18. Therefore, it is possible to measure the pressure by detecting the amount of distortion (or displacement) of the diaphragm as a change in the resistance (or capacitance).

The pressure introducing port 18 is a first through hole extending from the mounting surface 12A to the mounting surface 12B of the mounting substrate 12. The pressure introducing port 22 is a second through hole extending from the mounting surface 21A to a bottom surface 21B of the circuit board 21. The diameter of the pressure introducing port 22 is greater than the diameter of the pressure introducing port 18. The pressure sensor device 2 is surface-mounted on the circuit board 21 by soldering the terminals 19 with the solder 32 onto the mounting surface 21A such that the pressure introducing port 18 of the mounting substrate 12 and the pressure introducing port 22 of the circuit board 21 communicate with each other and the mounting surface 12B of the mounting substrate 12 and the mounting surface 21A of the circuit board 21 face each other. This configuration makes it possible to introduce the atmospheric pressure outside of the housing 16 to the diaphragm of the semiconductor pressure sensor element 11.

The pressure introducing port 18 passes through the mounting substrate 12 from the mounting surface 12A to the mounting surface 12B and is disposed below the diaphragm of the semiconductor pressure sensor element 11. In FIG. 2, 18A indicates an opening of the pressure introducing port 18 on the mounting surface 12A and 18B indicates an opening of the pressure introducing port 18 on the mounting surface 12B.

Figure 3:
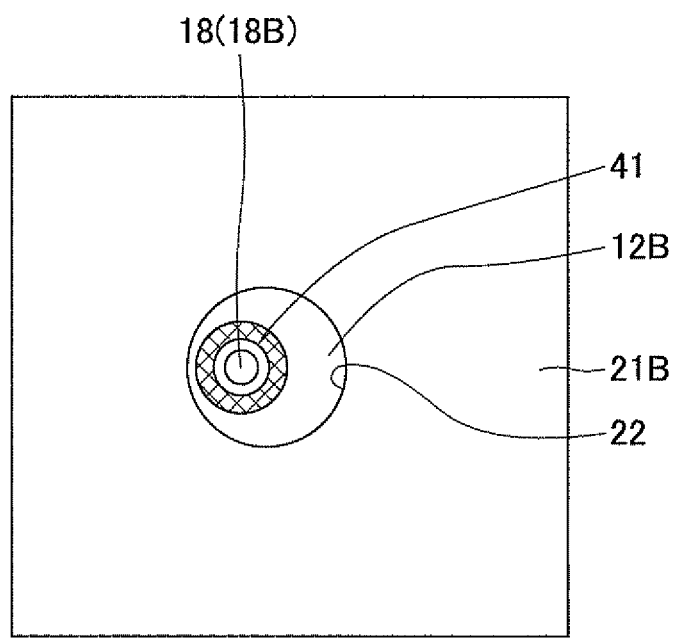
FIG. 3 is a bottom view of a circuit board.

A step-like structure 41 (a structure like a recess, a protrusion, etc.) is formed between the opening 18B and the terminals 19 so as not to contact the opening 18B and the terminals 19. The step-like structure 41 is formed on the mounting surface 12B of the mounting substrate 12. In the example of FIG. 2, the step-like structure 41 is a recess formed in the mounting surface 12B. As illustrated in FIG. 3, the step-like structure 41 may be shaped like a ring (or a circle) surrounding the opening 18B of the pressure introducing port 18. FIG. 3 illustrates the bottom surface 21B of the circuit board 21. As illustrated in FIG. 3, the pressure sensor device 2 is mounted on the circuit board 21 such that the opening 18B of the pressure introducing port 18 and the step-like structure 41 are located within a projection of the contour of the opening of the pressure introducing port 22 projected in the axial direction of the pressure introducing port 22 (i.e., an area defined by the opening of the pressure introducing port 22). In other words, the pressure sensor device 2 is mounted on the circuit board 21 such that the entirety of the opening 18B and the step-like structure 41 is observable from the bottom surface 21B through the pressure introducing port 22.

When soldering the pressure sensor device 2 onto the circuit board 21 through a reflow process, the step-like structure 41 formed on the mounting surface 12B of the mounting substrate 12 as described above makes it possible to stem the flow of flux that is liquefied due to the high temperature in the reflow furnace. That is, even if the liquefied flux flows into a gap 33 formed between the mounting surface 12B and the mounting surface 21A due to the capillary action, the flow of the liquefied flux is stopped by the step-like structure 41 before it reaches the pressure introducing port 18. This configuration makes it possible to prevent the pressure introducing port 18 from being clogged with the flux. Also, since the edge of the opening of the pressure introducing port 22 is located outside of the step-like structure 41, clogging of the pressure introducing port 22 with the flux can also be prevented.

The distance of the step-like structure 41 from the opening 18B, the depth of the step-like structure 41 in the thickness direction of the mounting substrate 12, and the width of the step-like structure 41 in a direction parallel to the surface of the mounting substrate 12 may be adjusted according to the amount of flux in the solder to effectively prevent the flux from clogging the pressure introducing ports 18 and 22. For example, at least one of the distance, the depth, and the width of the step-like structure 41 may be increased as the amount of flux increases.

Figure 4:
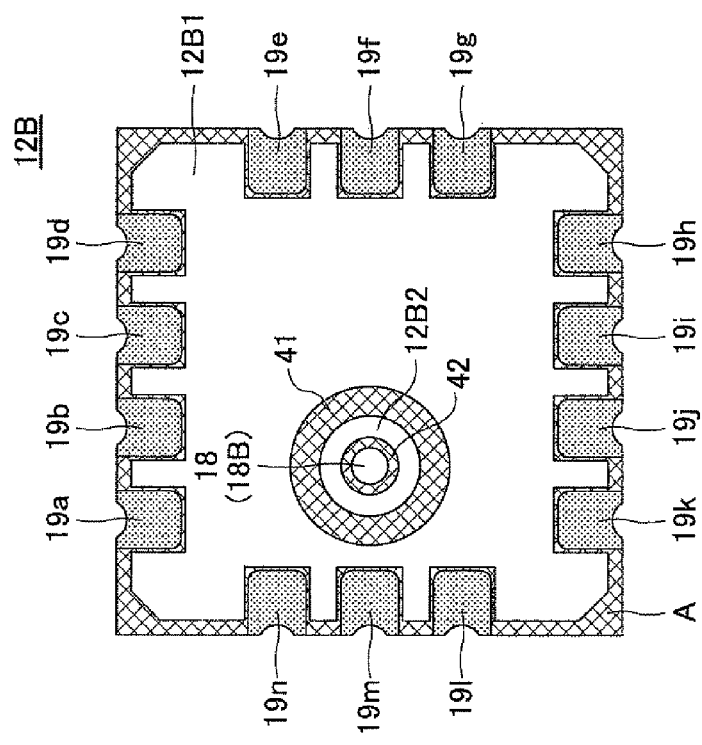
FIGS. 4A through 4C are drawings illustrating a mounting substrate.

Next, various examples of the step-like structure 41 are described. FIGS. 4A through 4C illustrate the mounting substrate 12. FIG. 4A is a plan view of the mounting substrate 12 as seen from the mounting surface 12A. FIG. 4B is a side view of the mounting substrate 12 as seen from a side surface 120. FIG. 4C is a bottom view of the mounting substrate 12 as seen from the mounting surface 12B. The mounting substrate 12 may be made of a material including, for example, a glass epoxy such as FR4. In FIGS. 4A through 4C, shaded areas are gold-plated and no resist film is formed on the shaded areas. Also in FIGS. 4A through 4C, lattice patterns indicate areas where no resist film and no copper foil are formed. Reference numbers 12A1, 12B1, and 12B2 indicate resist films formed on the base material surface of the mounting substrate 12. Multiple terminals 19 (19a through 19n) are formed on the periphery of the mounting substrate 12. The terminals 19 are electrically connected via a wiring pattern (not shown) to the bonding pads 14. The terminals 19 extend along the mounting surface 12A, the side surface 12C, and the mounting surface 12B.

Resist spacers 52 are provided as pedestals on which the semiconductor pressure sensor element 11 is mounted. The resist spacers 52 are protrusions formed between the opening 18A of the pressure introducing port 18 and the terminals 19 by removing a part of the resist film 12A1 on the mounting surface 12A. A resist-film-removed surface B is exposed as a result of removing the part of the resist film 12A1. Thus, the resist spacers 52 protrude from the resist-film-removed surface B and are disposed around the opening 18A of the pressure introducing port 18 at a distance from the opening 18A. The semiconductor pressure sensor element 11 is bonded to the resist spacers 52 with, for example, a die bonding resin. Disposing the resist spacers 52 at a distance from the opening 18A makes it possible to prevent the die bonding resin applied to the resist spacers 52 from flowing into the opening 18A. This in turn makes it possible to prevent the pressure introducing port 18 from being clogged by the die bonding resin.

In the example of FIGS. 4A through 4C, the step-like structure 41 is formed as a ring-shaped recess between a resist-film-removed portion 42 formed around the opening 18B and the terminals 19 by removing a part of the resist film 12B1 on the mounting surface 12B. When the pressure sensor device 2 is mounted on the circuit board 21 by soldering the terminals 19 provided on the mounting surface 12B onto the mounting surface 21A of the circuit board 21, the step-like structure 41 configured as described above makes it possible to prevent liquefied flux in the solder from flowing along the surface of the resist film 12B1 into the opening 18B of the pressure introducing port 18 and thereby makes it possible to prevent the liquefied flux from clogging the opening 18B.

Resist-film-removed portions A are formed on the periphery of the mounting substrate 12 by removing parts of the resist films 12A1 and 12B1. Forming the resist-film-removed portions A makes it possible to prevent cracks from being formed in the resist films 12A1 and 12B1 when dicing a substrate into multiple mounting substrates 12. The step-like structure 41 may be formed at the same time as when the resist-film-removed surface B is formed.

Figure 5:
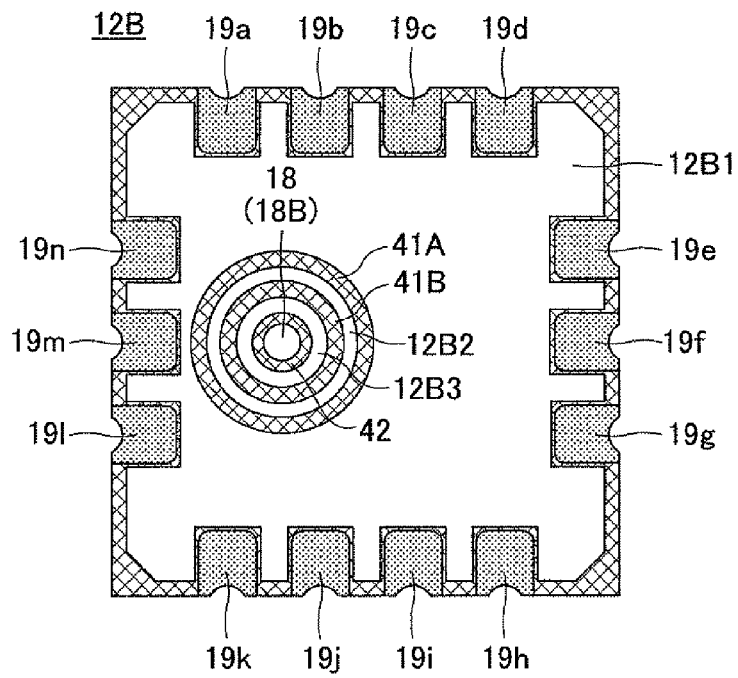
FIG. 5 is a bottom view of a mounting substrate.

In the example of FIG. 5, multiple step-like structures 41A and 41B are formed. The step-like structures 41A and 41B are formed by removing parts of the resist film 12B1 on the mounting surface 12B. The step-like structures 41A and 41B are ring-shaped recesses that are concentric with the opening 18B of the pressure introducing port 18. Forming multiple step-like structures 41 makes it possible to store a larger amount of liquefied flux.

Figure 6:
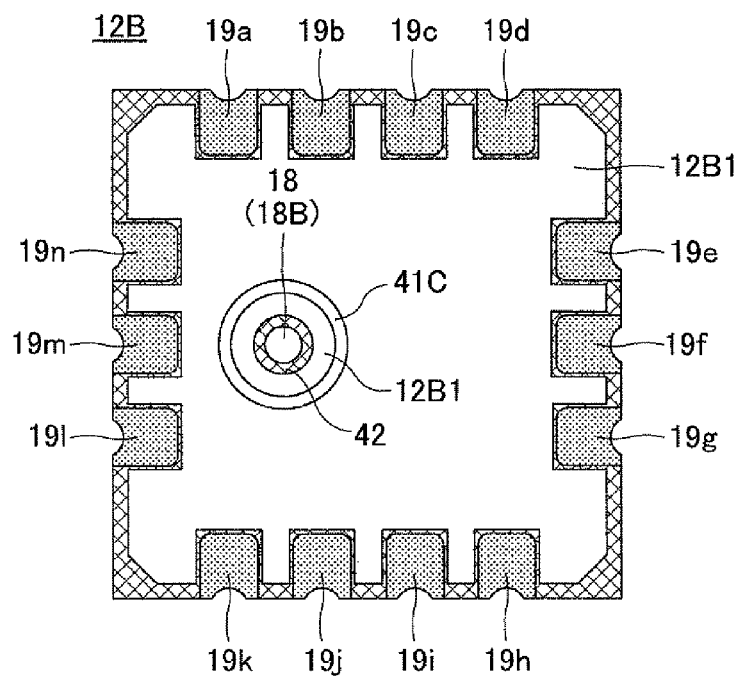
FIG. 6 is a bottom view of a mounting substrate.

In another example illustrated in FIG. 6, a step-like structure 41C is formed by silk-screen printing. The step-like structure 41C is implemented by a silk-screen print printed on the resist film 12B1 on the mounting surface 12B and forms a ring-shaped protrusion surrounding the opening 18B of the pressure introducing port 18. Thus, the step-like structure 41C protrudes from the resist film 12B1 on the mounting surface 12B. Accordingly, the surface of the step-like structure 41 is higher than the surface of the resist film 12B1. This configuration also makes it possible to prevent liquefied flux from flowing to the opening 18B of the pressure introducing port 18.

Figure 7:
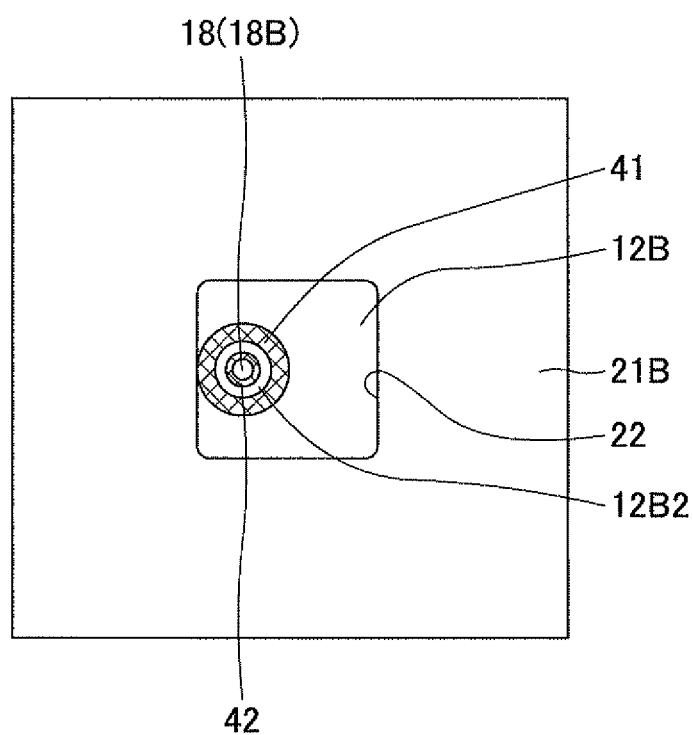
FIG. 7 is a bottom view of a circuit board where a square-shaped pressure introducing port is formed.
Figure 8A:
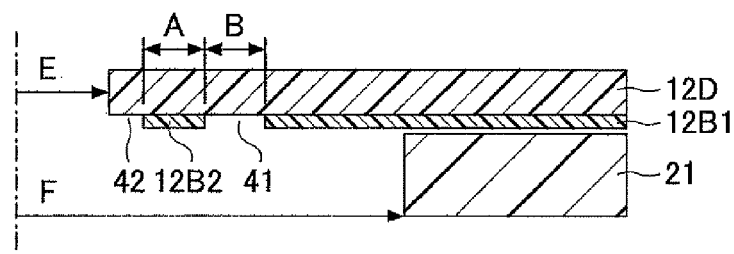
FIGS. 8A through 8F are drawings illustrating step-like structures with different configurations used in clogging tests.
Figure 8B:
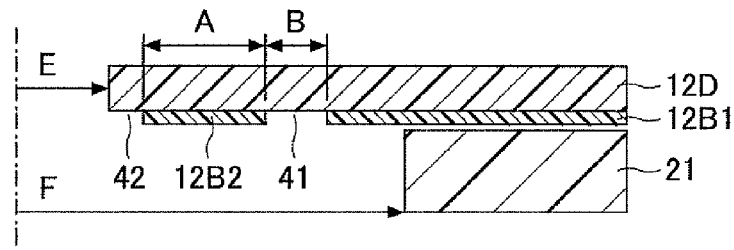
Figure 8C:
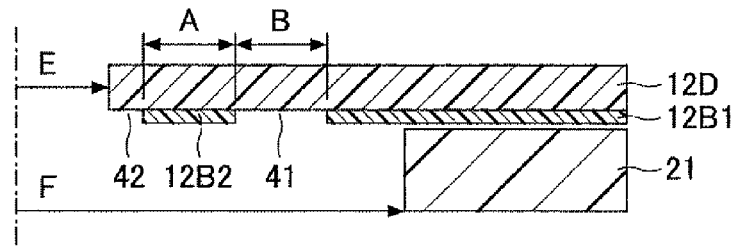
Figure 8D:
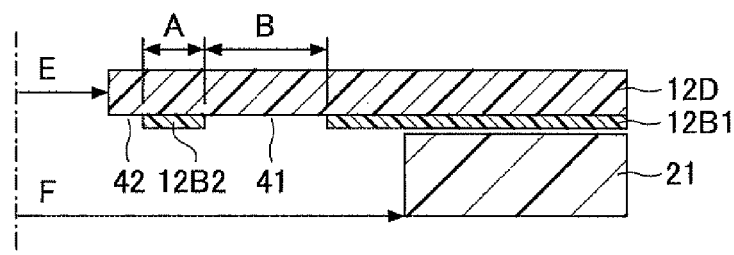
Figure 8E:
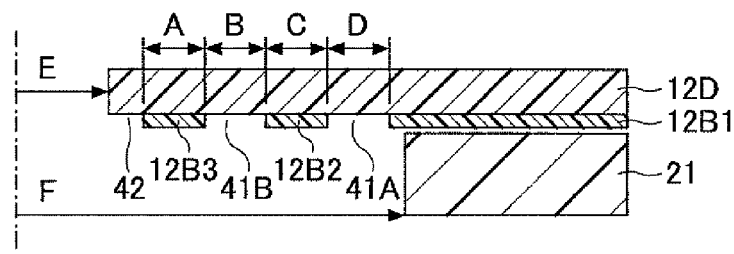
Figure 8F:
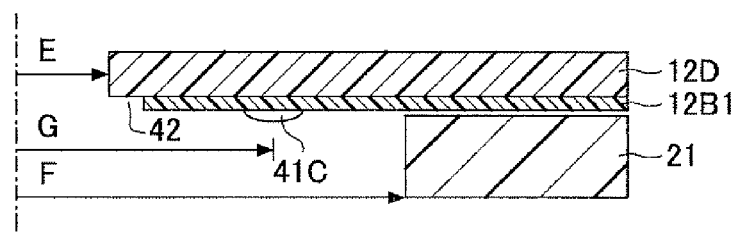
Figure 10A:
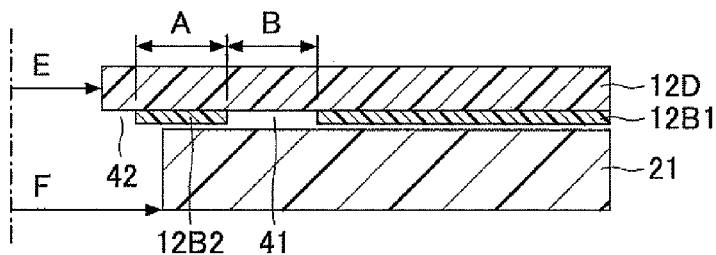
FIGS. 10A through 10F are drawings illustrating various configurations of a pressure introducing port of a circuit board used in clogging tests.
Figure 10B:
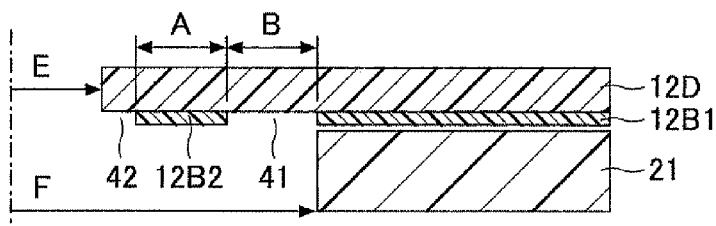
Figure 10C:
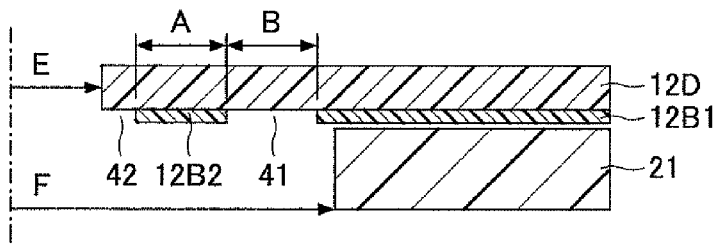
Figure 10D:
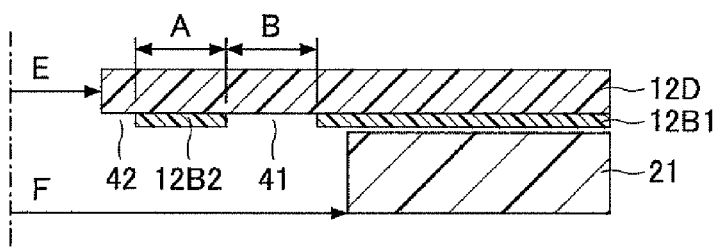
Figure 10E:
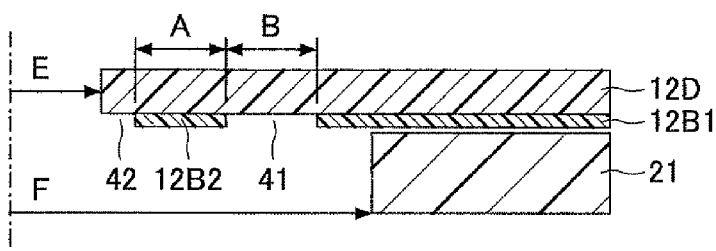
Figure 10F:
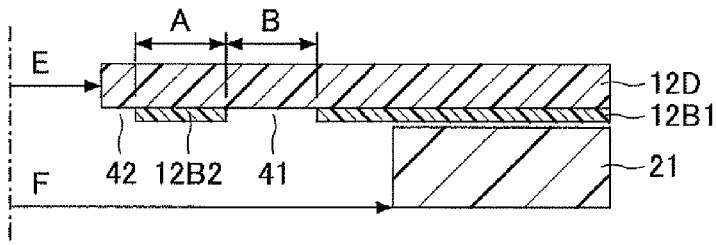

In FIG. 3, the openings of the pressure introducing port 22 of the circuit board 21 have a circular shape. However, the openings of the pressure introducing port 22 may have other shapes. For example, as illustrated in FIG. 7, the openings of the pressure introducing port 22 may have a quadrangular shape. Also, the openings of the pressure introducing port 18 of the mounting substrate 12 may not necessarily have a circular shape and may have any other shape such as a quadrangular shape.

"Clogging" tests were performed to confirm whether the pressure introducing port 18 was clogged by liquefied flux after the pressure sensor device 2 was soldered onto the circuit board 21 through a reflow process.

FIGS. 8A through 8F are drawings illustrating step-like structures 41 with different configurations used in the clogging tests. The step-like structures 41, 41A, and 41B illustrated in FIGS. 5A through 8E were formed by removing a part(s) of the resist film 12B1 formed on a base material 12D of the mounting substrate 12. Meanwhile, the step-like structure 41C illustrated in FIG. 8F was formed by silk-screen printing on the resist film 12B1 formed on the base material 12D of the mounting substrate 12. The step-like structures 41 of FIGS. 8A through 8D correspond to the embodiment illustrated by FIGS. 4A through 4C, the step-like structures 41A and 41B of FIG. 8E correspond to the embodiment illustrated by FIG. 5, and the step-like structure 41C of FIG. 8F corresponds to the embodiment illustrated by FIG. 6. In the clogging tests, a diameter E of the pressure introducing port 18 of the mounting substrate 12 was set at 0.5 mm, a diameter F of the pressure introducing port 22 of the circuit board 21 was set at 2.5 mm, a diameter G of the ring-shaped step-like structure 41C of FIG. 8F was set at 1.6 mm, and the width of the resist-film-removed portion 42 was set at 0.15 mm.

FIG. 9 is a table illustrating results of the clogging tests performed on the configurations of FIGS. 8A through 8F. In FIG. 9, "failure rate" indicates the percentage that the pressure introducing port 18 was clogged when a large amount of solder including flux was supplied. As is apparent from the results shown in FIG. 9, clogging of the pressure introducing port 18 can be more effectively prevented by increasing a width B of the step-like structure 41, i.e., the volume of a space formed by the step-like structure 41 where the liquefied flux is stored.

FIGS. 10A through 10F are drawings illustrating various configurations of the pressure introducing port 22 of the circuit board 21 used in clogging tests of the pressure introducing port 18. The pressure introducing ports 22 illustrated in FIGS. 10A through 10F have different diameters F. In the clogging tests, a width A of the resist film 12B2 was set at 0.3 mm, a width B of the step-like structure 41 was set at 0.3 mm, a diameter E of the pressure introducing port 18 of the mounting substrate 12 was set at 0.5 mm, and the width of the resist-film-removed portion 42 was set at 0.15 mm.

Figure 11:
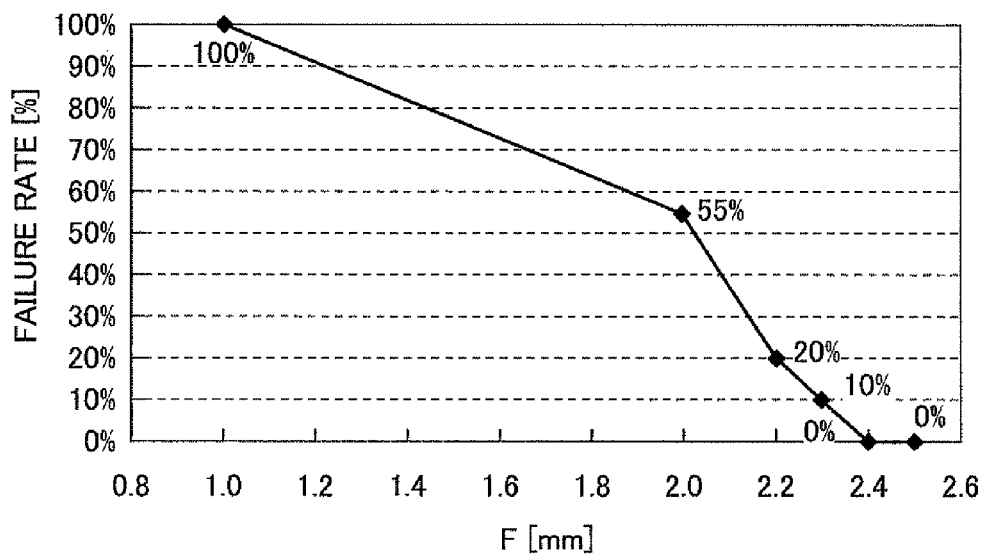
FIG. 11 is a graph illustrating results of clogging tests.

FIG. 11 is a graph illustrating results of the clogging tests performed on the configurations of FIGS. 10A through 10F. In FIG. 11, "failure rate" indicates the percentage that the pressure introducing port 18 was clogged when a large amount of solder including flux was supplied. As is apparent from the results shown in FIG. 11, it is possible to effectively prevent the liquefied flux from clogging the pressure introducing port 18 if the mounting substrate 12 is soldered onto the circuit board 21 such that the pressure introducing port 18 of the mounting substrate 12 and the step-like structure 41 are positioned within a projection of (the opening of) the pressure introducing port 22 of the circuit board 21. In other words, it is preferable to place the edge of the opening of the pressure introducing port 22 of the circuit board 21 as far away as possible from the step-like structure 41. For example, the distance between the edge of the opening of the pressure introducing port 22 and the step-like structure 41 is preferably greater than or equal to 0.1 mm and more preferably greater than or equal to 0.15 mm.

Preferred embodiments of the present invention are described above. However, the present invention is not limited to the specifically disclosed embodiments, and variations and modifications may be made without departing from the scope of the present invention.

Figure 12:
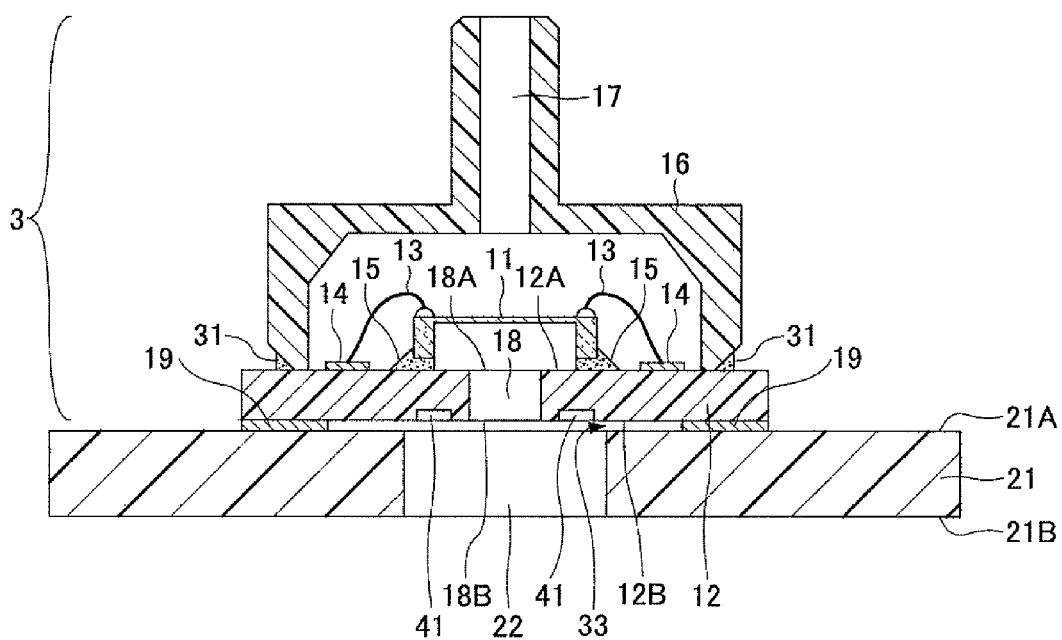
FIG. 12 is a drawing illustrating an exemplary configuration of terminals.
Figure 13:
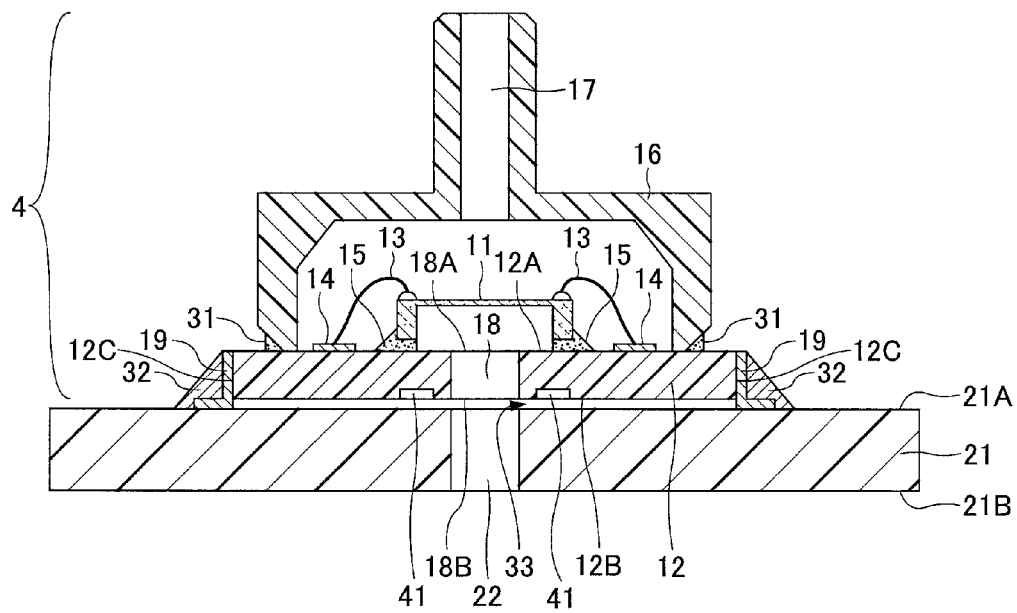
FIG. 13 is a drawing illustrating another exemplary configuration of terminals.
Figure 14:
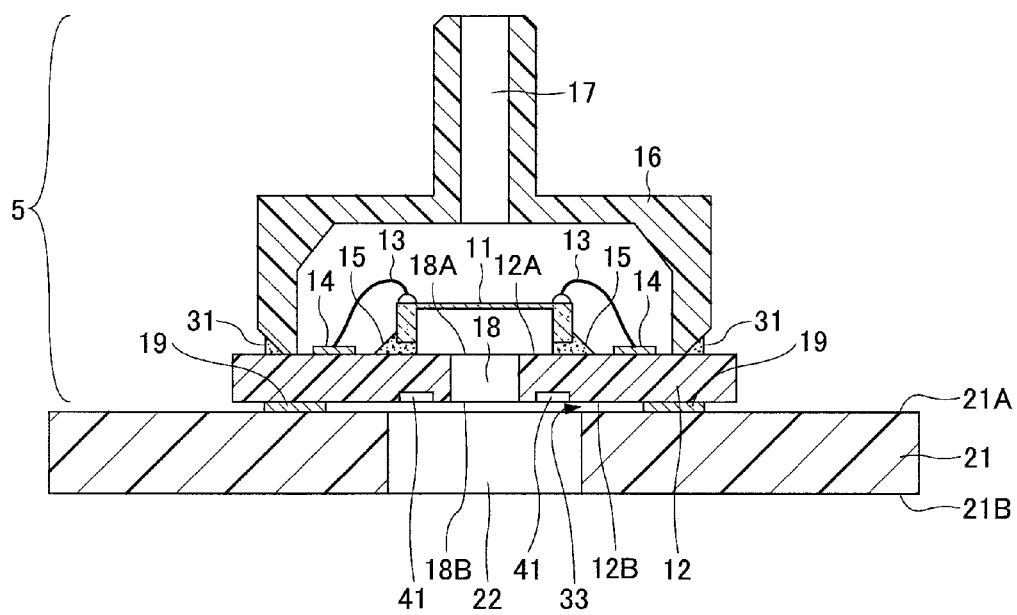
FIG. 14 is a drawing illustrating still another exemplary configuration of terminals.

For example, the terminals 19 (soldered parts) may be configured as illustrated in FIGS. 12 through 14. In FIG. 12, the terminals 19 are provided only on the periphery of the mounting surface 12B. In FIG. 13, the terminals 19 are provided on the side surface 12C and extend outward from the mounting substrate 12. In FIG. 14, the terminals 19 are provided only on inner areas of the mounting surface 12B away from the edge of the mounting surface 12B.

The step-like structure 41 is preferably configured to surround the entire circumference of the opening 18B of the pressure introducing port 18. However, depending on the direction of flow of liquefied flux, the step-like structure 41 may be configured to surround a part of the circumference of the opening 18B. In other words, the step-like structure 41 may be formed in a position(s) where the step-like structure 41 can effectively prevent liquefied flux from flowing into the pressure introducing port 18.

The fluid supplied from the pressure introducing port 18 is not limited to the atmosphere. The pressure sensor device 2 illustrated in FIG. 2 is configured to measure the pressure of a fluid such as a gas supplied from the pressure supply port 17. Alternatively, the pressure sensor device 2 may be configured to measure the pressure of a fluid such as a gas supplied from the pressure introducing ports 18 and 22.

An aspect of this disclosure provides a pressure sensor device, an electronic apparatus including the pressure sensor device, and a method of mounting the pressure sensor device that make it possible to prevent a pressure introducing port from being clogged by flux.

What is claimed is:

1. A pressure sensor device, comprising:
   a semiconductor pressure sensor element; and
   a base part including
   a mounting surface,
   a through hole having an opening on the mounting surface and configured to introduce a fluid to the semiconductor pressure sensor element,
   a soldered part that is to be soldered and is provided on the mounting surface, and
   a step-like structure formed on the mounting surface between the opening and the soldered part,
   wherein a gap exists between the soldered part and the step-like structure said gap existing between the mounting surface and another surface that is to be soldered to said soldered part.

2. The pressure sensor device as claimed in claim 1, wherein the step-like structure is a recess formed in a resist film on the mounting surface.

3. The pressure sensor device as claimed in claim 1, wherein the step-like structure is a silk-screen print printed on the mounting surface.

4. An electronic apparatus, comprising:
   a pressure sensor device including
   a semiconductor pressure sensor element, and
   a base part that includes
   a first mounting surface,
   a through hole having an opening on the first mounting surface and configured to introduce a fluid to the semiconductor pressure sensor element,
   a soldered part that is to be soldered and is provided on the first mounting surface, and
   a step-like structure formed on the first mounting surface between the opening of the through hole and the soldered part; and
   a mounting part including
   a second mounting surface on which the pressure sensor device is mounted by soldering the soldered part onto the second mounting surface, and
   a communicating hole having an opening on the second mounting surface and communicating with the through hole,
   wherein the pressure sensor device is mounted on the second mounting surface such that the opening of the through hole and the step-like structure are located within a projection of the opening of the communicating hole, and
   wherein a gap exists between the soldered part and the step-like structure, said gap existing between the first mounting surface and the second mounting surface.

5. A method of mounting a pressure sensor device on a mounting part,
   wherein the pressure sensor device includes
   a semiconductor pressure sensor element, and
   a base part including
   a first mounting surface,
   a through hole having an opening on the first mounting surface and configured to introduce a fluid to the semiconductor pressure sensor element,
   a soldered part that is to be soldered and is provided on the first mounting surface, and
   a step-like structure formed on the first mounting surface between the opening of the through hole and the soldered part;
   wherein the mounting part includes
   a second mounting surface on which the pressure sensor device is mounted by soldering the soldered part onto the second mounting surface, and
   a communicating hole having an opening on the second mounting surface and communicating with the through hole,
   wherein a gap exists between the soldered part and the step-like structure, said gap existing between the first mounting surface and the second mounting surface,
   the method comprising:
   mounting the pressure sensor device on the second mounting surface such that the opening of the through hole and the step-like structure are located within a projection of the opening of the communicating hole.

* * * * *